United States Patent [19]

Ueda et al.

[11] Patent Number: 4,933,637

[45] Date of Patent: Jun. 12, 1990

[54] APPARATUS FOR DETECTING A MAGNETIC FIELD HAVING AN EXCITATION CURRENT SOURCE UNIT, A DETECTION UNIT AND A CURRENT CONTROL SOURCE UNIT

[75] Inventors: Ryuzo Ueda; Toshikatsu Sonoda, both of Kitakyushu; Toshiyuki Irisa; Shigeo Takata, both of Kagoshima, all of Japan

[73] Assignee: Meguro Electric Mfg. Co., Ltd., Tokyo, Japan

[21] Appl. No.: 306,203

[22] Filed: Feb. 2, 1989

Related U.S. Application Data

[62] Division of Ser. No. 44,903, Apr. 29, 1987, abandoned.

[51] Int. Cl.$^5$ .............................................. G01R 33/04
[52] U.S. Cl. ...................................... 324/253; 324/260
[58] Field of Search ............... 324/244, 253, 254, 255, 324/260

[56] References Cited

U.S. PATENT DOCUMENTS

| | | | |
|---|---|---|---|
| 3,040,248 | 6/1962 | Geyger | 324/253 |
| 3,461,382 | 8/1969 | Anderson | 324/253 |
| 4,303,886 | 12/1981 | Rhodes | 324/255 |

*Primary Examiner*—Reinhard J. Eisenzopf
*Assistant Examiner*—Walter E. Snow
*Attorney, Agent, or Firm*—Wenderoth, Lind & Ponack

[57] ABSTRACT

An apparatus for detecting a magnetic field includes a magnetic core, an excitation current source unit, a magnetic flux detecting unit, and a current control source unit. The excitation current source unit includes a first excitation winding disposed around the core, an amplifier having an output coupled to the first excitation winding, and a subtractor for applying to the amplifier a first difference between a voltage corresponding to a supplied excitation current and a voltage corresponding to a current passing through the first excitation winding. The magnetic flux detecting unit includes a second excitation winding disposed around the core, a waveform shaping circuit for shaping the waveform of a voltage induced in the second excitation winding, a pulse generating circuit for outputting pulses in synchronism with the shape waveform voltage, and a sample-and-hold circuit for sampling and holding the voltage corresponding to the supplied excitation current. The current control source unit includes a third excitation winding disposed around the core, a subtracter for outputting a second difference between an output of the sample-and-hold means in a predetermined output value, and a proportional-plus-integral circuit for outputting a control current command signal according to the second difference. The magnetic field detected in response to the control current command signal applied to the third excitation winding.

1 Claim, 2 Drawing Sheets

APPARATUS FOR DETECTING A MAGNETIC FIELD HAVING AN EXCITATION CURRENT SOURCE UNIT, A DETECTION UNIT AND A CURRENT CONTROL SOURCE UNIT

This application is a division of now abandoned application Ser. No. 044,903 filed Apr. 29, 1987.

BACKGROUND OF THE INVENTION AND RELATED ART STATEMENT

The present invention relates to a method for detecting a magnetic field by placing part of a core excited beforehand in a magnetic field under measurement and utilizing a variation in a magnetic flux resulting from the magnetization of the part of the core.

A typical example of magnetic field detecting methods which have heretofore been known to the art is a method utilizing a Hall element. The prior art method is adapted to detect an external magnetic field from a Hall voltage obtained by the intensity of the magnetic field passing through the Hall element. However, since a Hall element has a very inferior temperature characteristic and is instable in environmental temperatures and since it is difficult to manufacture a Hall element having a large area, the prior art method is not suitable for the detection of a magnetic field over a wide range and is restricted in its own use.

OBJECT AND SUMMARY OF THE INVENTION

The present invention has been accomplished in view of the aforementioned drawbacks suffered by the prior art method.

The main object of the present invention is to provide a magnetic field detecting method which utilizes the principle of a so-called zero magnetic flux process to sense a magnetic field with high precision and stably detect the magnetic field over a wide range of distribution by the use of a small-sized high-performance open magnetic circuit comprising a short core and three wirings coiled therearound.

To attain the object described above, according to the present invention, there is provided a method for detecting a magnetic field, which comprises forming an open magnetic circuit of a core and an excitation wiring, a detection wiring and a control wiring which are coiled around the core; exciting the core by means of the excitation wiring to induce in the detection wiring a reference voltage determined by the magnetizing characteristic of the core; placing exposed part of the core in a magnetic field under measurement to be magnetized; detecting a variation in a magnetic flux resulting from the magnetization of the exposed part of the core as a variation in the reference voltage; deexciting the core by means of the control wiring to attenuate or offset the variation in the reference voltage; and detecting the magnetic field under measurement from a control electric current used for attenuating or offsetting the variation in the reference voltage.

The above and other objects, characteristic features and advantages of the present invention will become more apparent to those skilled in the art as the disclosure is made in the following description of a preferred embodiment of the invention, as illustrated in the accompanying drawings.

DETAILED DESCRIPTION OF THE PREFERRED EMBODIMENT

Figure 1:
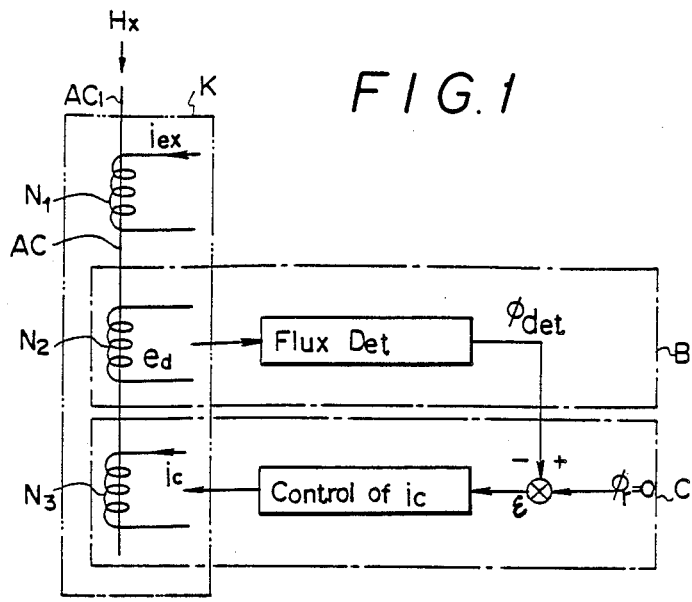
FIG. 1 is a circuitry diagram illustrating the principle of the magnetic field detecting method according to the present invention.

The present inventors previously developed and proposed an electric current detector of a triangular wave system or an integration system using as a detection element a transformer having four wirings and utilizing a so-called zero magnetic flux process.

The present invention is a development of the electric current detector, which makes it possible to detect a magnetic field utilizing the zero magnetic flux process.

The principle of the magnetic field detecting method according to the present invention will now be described with reference to FIG. 1. A core AC is made of a soft magnetic material and has at least three wirings coiled therearound to constitute an open magnetic circuit adapted to be magnetized in one direction when it is placed in a magnetic field. The first, second and third wirings are specified respectively as an excitation wiring $N_1$, a detection wiring $N_2$ and a control wiring $N_3$. The core AC is preferably formed in the shape of a straight rod and has the portion thereof, around which was the three wirings are coiled, surrounded by an enclosure $\underline{K}$ so that the portion is isolated from a magnetic field. Part of the core AC is exposed to a magnetic field. The exposed part of the core AC is designated as a detection portion $AC_1$ for detecting a magnetic field Hx under measurement.

It will be understood from the excitation wiring $N_1$ and detection wiring $N_2$ how the core AC is magnetized by the magnetic field Hx under measurement. The core AC has been excited in advance by applying an electric current iex of an alternate wave such as a sine wave, triangular wave, trapezoidal wave, etc. to the excitation wiring $N_1$. Therefore, the detection wiring $N_2$ has induced a voltage ed which is determined by the magnetizing characteristic of the core AC and the exciting current iex applied to the excitation wiring $N_1$. The voltage ed is inputted into a magnetic flux detecting circuit Flux Det in the form of a reference voltage when the detection portion $AC_1$ of the core AC is not placed in the magnetic field Hx and in a varied form when the detection portion $AC_1$ is placed in the magnetic field Hx. The magnetic flux detecting circuit Flux Det is adapted to detect a variation of the magnetic flux in the core AC on the basis of the variation of the induced voltage ed in the detection wiring $N_2$ made by both the excitation of the core AC by means of the excitation wiring $N_2$ and the magnetization of the detection portion $AC_1$ by means of the magnetic field Hx and to issue a detected output $\phi$det corresponding to asymmetry between the positive and negative portions of the phase or amplitude of the magnetizing curve. The place where the magnetic flux detecting circuit Flux Det functions is called a magnetic flux detection section $\underline{B}$ as shown in FIG. 1.

The core AC excited in advance by the excitation wiring $N_1$ is magnetized by placing the exposed detection portion $AC_1$ of the core AC in the magnetic field Hx under measurement to vary the magnetic flux in the core AC. The reference voltage varied in the detection wiring $N_2$ by the variation of the magnetic flux is detected by the magnetic flux detecting circuit Flux Det and is outputted from the circuit Flux Det in the form of the detected output $\phi$det. An electric current ic corresponding to the detected output $\phi$det is applied to the control wiring $N_3$, thereby deexciting the core AC to attenuate or offset the variation of the magnetic flux.

In FIG. 1, a target value $\phi_r$ is set zero and a control electric current for offsetting the variation is applied to the control wiring $N_3$. The term "Control of ic" in FIG. 1 designates a control electric current applying circuit for applying the electric current ic for attenuating or offsetting the variation to the control wiring $N_3$ on the basis of the detected output $\phi$det, and reference symbol "$\epsilon$" in FIG. 1 denotes the difference between the detected output $\phi$det and the target value $\phi_r$. The place where the control electric current applying circuit Control of ic functions is called a control electric current source C. The magnetic field Hx can be detected from the control electric current ic applied to the control wiring $N_3$.

Figure 2:
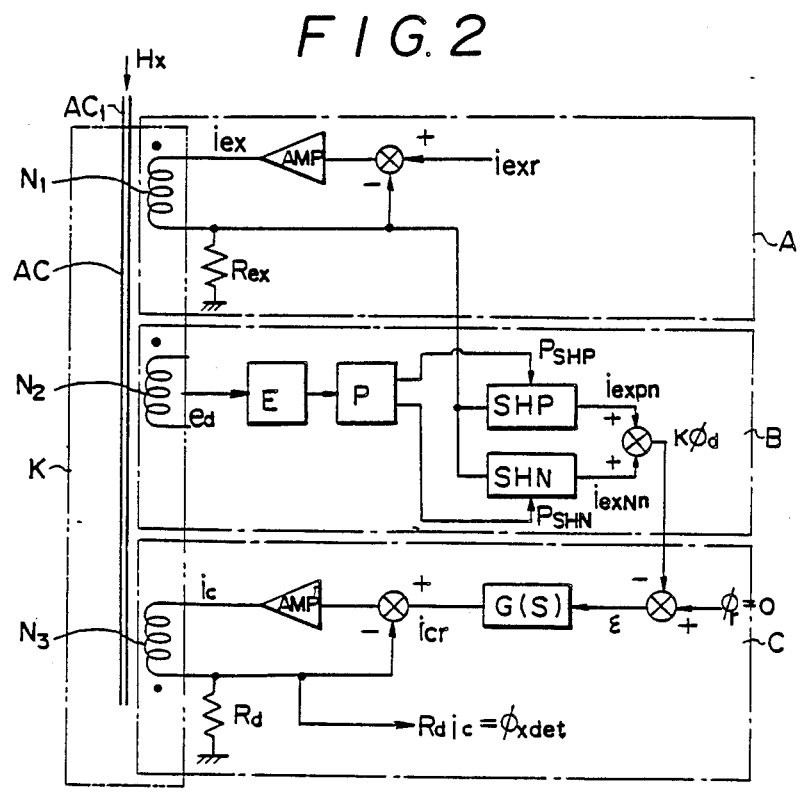
FIG. 2 is a circuitry diagram illustrating one embodiment of the magnetic field detecting method according to the present invention.

FIG. 2 is a circuitry diagram illustrating one embodiment of the magnetic field detecting method according to the present invention, in which a triangular wave system utilizing the aforementioned principle is adopted. As shown in FIG. 2, a current amplifier (an excitation current source A) comprises an amplifier AMP, an excitation wiring $N_1$ and a resistor Rex. With the excitation current source A a core AC is excited by applying thereto a triangular wave current iex of a peak value large enough to saturate the core AC. A magnetic flux detection section B comprises a waveform shaping circuit E for shaping the waveform of voltage induced in a detection wiring $N_2$ by the excitation of the core AC by means of the triangular wave current iex and magnetic field Hx under measurement, a pulse generating circuit P for outputting pulses (shown as outputs from the circuit P in FIG. 3 and FIG. 4) of a width sufficiently shorter than the period or a triangular wave in synchronism with the leading edges of the shaped voltage waveform, sample-and-hold circuits SHP and SHN for sampling and holding the triangular wave current with the outputted pulses serving as sampling pulses. A control current source C comprises a proportional-plus-integral circuit G(S) for outputting a control current command signal icr on the basis of a difference $\epsilon$ between a detected signal K$\phi$d outputted from the magnetic flux detection section B and a target value $\phi$r, an amplifier AMP' for inputting the control current command signal icr, and a control wiring $N_3$ to which a control current outputted from the amplifier AMP' is applied. The core AC is made of a soft magnetic material, e.g. an amorphous opened core having a sharp square-shaped characteristic. When the core AC is excited by the excitation triangular wave current source A, the detection wiring $N_2$ induces a voltage ed corresponding to the magnetizing characteristic of the amorphous opened core.

Figure 3:
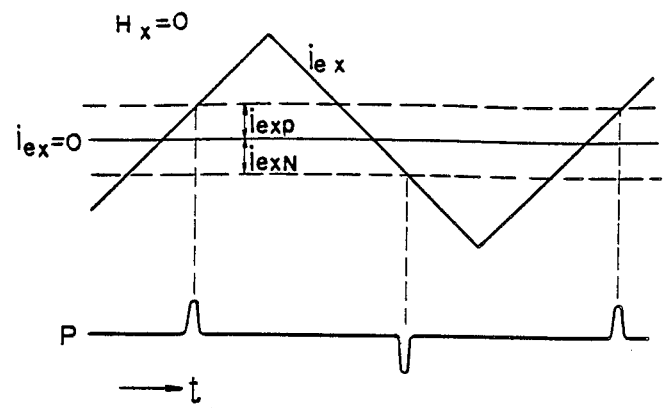
FIG. 3 is a waveform diagram obtained when a magnetic field under measurement is zero.

In the steady state or when the magnetic field Hx in which a detection portion $AC_1$ of the core AC is placed is null, current intensities iexP and iexN are equal to each other and have opposite polarities. Therefore, the positive and negative portions of the waveform of the voltage ed induced in the detection wiring $N_2$ are symmetrical to each other as shown in FIG. 3 and the detected output K$\phi$d from the magnetic flux detection section B is null. That is to say, no variation of the magnetic flux is detected.

Figure 4:
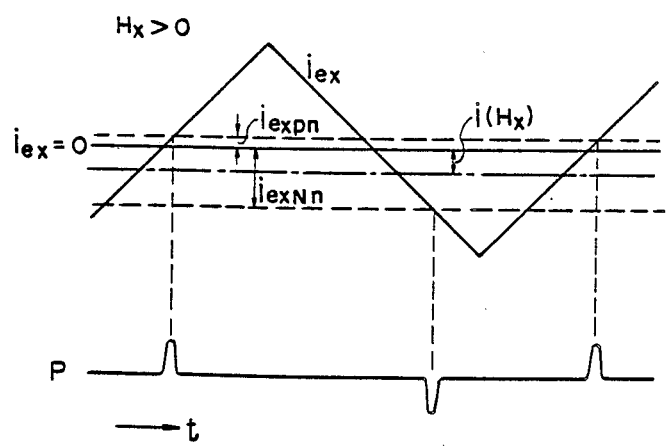
FIG. 4 is a waveform diagram obtained when a magnetic field under measurement has been detected.

When the magnetic field Hx in which the detection portion $AC_1$ of the core AC is placed is not null, however, the magnetic flux in the core AC is varied to plus by a current i(Hx) corresponding to the excitation current of the magnetic field Hx and, at the same time, the phase of the voltage ed induced in the detection wiring $N_2$ is varied. Therefore, the waveform of the induced voltage ed including this variation is shifted in phase. That is to say, the positive and negative portions of the waveform of the voltage ed are asymmetrical to each other as shown in FIG. 4.

The asymmetrical voltage ed is applied to the waveform shaping circuit E to be shaped in waveform. In synchronism with the leading edges of the shaped voltage waveform, pulses of a width sufficiently shorter than the period of a triangular wave are outputted from the pulse generating circuit P. The positive and negative signals $P_{SHP}$ and $P_{SHN}$ of the pulses are inputted as timing signals to the sample-and-hold circuits SHP and SHN, respectively. When the sample-and-hold circuits SHP and SHN receive the timing signals, they output excitation currents iexPn and iexNn. The sum of the outputted currents iexPn and iexNn corresponds to the variation of the voltage induced in the magnetic flux detection section B, i.e. the variation of the magnetic flux, and is represented by a detected output K$\phi$d. The detected output K$\phi$d corresponds to the intensity of the magnetic field Hx under measurement.

In the control current source C, the control current command signal icr is outputted from the proportional-plus-integral circuit G(S) on the basis of the difference $\epsilon$ between the detected output K$\phi$d and the target value $\phi$r (i.e. $\phi r - K\phi d = \epsilon$) and is applied to the control wiring $N_3$ via the amplifier AMP' in the form of a control current ic.

By means of the control current ic the core AC is deexcited to attenuate or offset the variation of the magnetic flux, i.e. the difference between the induced voltage and the reference voltage. The magnetic field Hx under measurement is detected from the control current ic applied to the control wiring $N_3$ for the aforementioned attenuation or offset. In FIG. 2, reference symbol Rd designates a resistor for outputting the presence of the magnetic field in the form of a voltage. That is to say, a signal $\phi$det indicating the detection of the magnetic field is outputted as a voltage Rdic.

In the aforementioned embodiment, the magnetic field detecting method of the present invention utilizes the triangular wave system. However, this is by no means limitative. For example, the zero magnetic flux process of an integration system may be utilized insofar as the process complies with the principle of FIG. 1. In this case, corresponding results can be obtained.

To be specific, the integration system utilizes the fact that the positive and negative amplitudes of the waveform of the voltage induced in the detection wiring $N_2$ are varied by the magnetic field under measurement. The positive and negative voltages distorted and asymmetrical to each other are sliced at a level higher than a prescribed amplitude and the resultant voltages are added and integrated over a period of the excitation current to obtain a final value. By sampling and holding the final value there is obtained a detected output corresponding to the variation of the magnetic flux, from which it will be understood how the core AC is biased by the magnetic field Hx under measurement. Similarly to the case of the aforementioned triangular wave system, when a control current ic is applied in the control current source $\underline{C}$ so as to attenuate or offset the variation, the magnetic field Hx under measurement can be detected from the control current ic.

As described above, according to the present invention, it is possible to provide a small-sized high-performance magnetic field detecting apparatus by making use of an open magnetic circuit formed of a core and excitation, detection and control wirings. According to the present invention, since a magnetic field under measurement can be detected from the intensity of a current applied to the control wiring for attenuating or offsetting the variation of the voltage induced in the detection wiring, the range of detection of a magnetic field can considerably be widened and, by suitably selecting the thickness of the wirings, size of the core and the capacity of the circuits, the magnetic field of any intensity can be detected. Further, according to the present invention, stable detection of a magnetic field can be attained without being influenced by disturbance factors such as the environmental temperature etc.

What is claimed is:

1. An apparatus for detecting a magnetic field comprising:

a core made of a magnetic material;

an excitation current source including: a first excitation winding disposed around said core; an amplifier having an output coupled to said first excitation winding for providing a current thereto; and a means for applying to an input of said amplifier a first difference between a voltage corresponding to a supplied excitation current and a voltage corresponding to a current passing through said first excitation winding;

a magnetic flux detection means including: a second excitation winding disposed around said core; a waveform shaping circuit connected to said second excitation winding for shaping a waveform of a voltage induced in said second excitation winding; a pulse generating circuit coupled to said waveform shaping circuit for outputting pulses having a width shorter than a pulse width of said excitation current and in synchronism with the shaped voltage waveform; and a sample-and-hold means coupled to said first excitation winding and said pulse generating circuit for sampling and holding said voltage corresponding to said supplied excitation current; and a current control source including: a third excitation winding disposed around said core; a means for outputting a second difference between an output of said sample-and-hold means and a predetermined target value; and a means for outputting a control current signal which is proportional to a linear combination of said second difference and a time integral of said second difference, said control current command signal being applied to said third excitation winding, wherein the magnetic filed is detected in response to said control current command signal applied to said third excitation winding.

* * * * *